(12) United States Patent
Cappellani et al.

(10) Patent No.: US 7,053,454 B1
(45) Date of Patent: May 30, 2006

(54) SEMICONDUCTOR COMPONENT, METHOD FOR PRODUCING THE SEMICONDUCTOR COMPONENT, AND METHOD FOR PRODUCING ELECTRICAL CONNECTIONS BETWEEN INDIVIDUAL CIRCUIT ELEMENTS

(75) Inventors: Annalisa Cappellani, Portland, OR (US); Rudolf Lachner, Ingolstadt (DE)

(73) Assignee: Infineon Technologies AG, Munich (DE)

( * ) Notice: Subject to any disclaimer, the term of this patent is extended or adjusted under 35 U.S.C. 154(b) by 392 days.

(21) Appl. No.: 10/253,751

(22) Filed: Sep. 24, 2002
(Under 37 CFR 1.47)

Related U.S. Application Data

(63) Continuation of application No. PCT/DE01/01080, filed on Mar. 19, 2001.

(30) Foreign Application Priority Data

Mar. 24, 2000 (EP) .................................. 00106458

(51) Int. Cl.
*H01L 29/72* (2006.01)
(52) U.S. Cl. ..................... 257/408; 257/409; 257/411
(58) Field of Classification Search ............... 257/408, 257/409, 411
See application file for complete search history.

(56) References Cited

U.S. PATENT DOCUMENTS 4,424,621 A 1/1984 Abbas et al.
5,545,926 A * 8/1996 Kohyama et al. ........... 257/755
5,554,549 A 9/1996 Huang
5,950,090 A 9/1999 Chen et al.

FOREIGN PATENT DOCUMENTS

| FR | 2 757 312 A1 | 6/1998 |
|---|---|---|
| JP | 7 324 749 | 12/1995 |
| JP | 11 074 219 | 3/1999 |
| WO | WO 98/53492 | 11/1998 |

OTHER PUBLICATIONS

Widmann, D. et al.: "Technologie hochintegrierter Schaltungen" [Technology High-Density Integrated Circuits], Springer Verlag, 2nd Edition, 1996.
Alvarez, A. R.: "BiCMOS Technology and Applications", Kluwer Academic Publishers, 1989.

* cited by examiner

*Primary Examiner*—Edward Wojciechowicz
(74) *Attorney, Agent, or Firm*—Laurence A. Greenberg; Werner H. Stemer; Ralph E. Locher

(57) ABSTRACT

A fabrication method produces an integrated component on a semiconductor substrate and having a plurality of electrode connections formed to project from to the main surface of the substrate. The electrode connections are simultaneously formed by removing the electrode connection layer and/or the insulation covering layer in regions adjoining the electrode connections. Furthermore, electrical connections are produced between individual circuit elements formed on or in a semiconductor substrate, interconnect channels being made in the planarized area with circuit elements and filling material. The interconnect channels are filled with a readily conductive material. The semiconductor component has a plurality of electrode connections that project from the substrate.

11 Claims, 7 Drawing Sheets

SEMICONDUCTOR COMPONENT, METHOD FOR PRODUCING THE SEMICONDUCTOR COMPONENT, AND METHOD FOR PRODUCING ELECTRICAL CONNECTIONS BETWEEN INDIVIDUAL CIRCUIT ELEMENTS

CROSS-REFERENCE TO RELATED APPLICATION

This application is a continuation of copending International Application No. PCT/DE01/01080, filed Mar. 19, 2001, which designated the United States and was not published in English.

BACKGROUND OF THE INVENTION

Field of the Invention

The invention relates to a method for producing an integrated component formed on a semiconductor substrate and having a plurality of electrode connections which are formed such that they project relative to the main surface of the substrate, to a method for producing electrical connections between individual circuit elements formed on or in a semiconductor substrate and to a semiconductor component having a plurality of electrode connections which are formed in a projecting manner.

In order that transistors, in particular field-effect transistors, can operate even in a very high frequency range, namely a few gigahertz, they must have very low parasitic capacitances and impedances, since these limit the performance and usability of the entire transistor. Thus, the parasitic capacitances and impedances limit, in particular, the switching speed and the maximum oscillation frequency and impair the noise behaviour. If a transistor is used within an integrated electronic circuit on or in a semiconductor substrate, the interconnect system which connects the individual components of the circuit is also of great importance to the switching speed of the circuit and, for a high power yield and thus also to attain an increase in speed, it is necessary that the interconnect system has the smallest possible resistance.

Simply as a result of the reduction in the dimensions of previously known transistor structures, for example reduction in the gate length of a field-effect transistor to about 100 nanometers, the resistance is drastically increased due to lithographic and physical effects ("narrow line effects"), in particular if conventional siliciding of gate electrodes is used for contact-connecting the latter, since the small amount of material is reduced even further here. Reducing the size of the conventional structures, in particular the gate lengths and the further dimensions associated therewith, is also accompanied by the need to reduce the vertical dimensioning of the structures, in order to keep short channel effects within limits. Contact-connecting such planar electrode connections additionally requires an enormous technical outlay on patterning. Moreover, the silicidation consumes a considerable proportion of the highly doped regions of the planar electrode connections, thereby adversely affecting the functionality and the physical parameters. Specifically, the contact resistances are once again considerably increased in this case, too. If the dimensioning sizes are in the sub-micron range, then the greatest obstacles are constituted by the short channel effects as bridges or breakdown zones and the reduction in the transistor electrons ("hot electrons"). One means of combating this is to increase the substrate doping, which in turn obtains a disadvantageous effect in an increase in the connection capacitance.

The parasitic capacitances are considerably increased by the spatial proximity between the individual electrodes. Obtaining such small structures necessitates a technically very complicated and very expensive lithography in order to be able to realize the small structures.

Japanese published patent application JP-A 07-324 749 discloses a semiconductor component and a method for producing it wherein an auxiliary structure is employed, which serves as an insulation layer for reducing the connection capacitance. However, with this procedure it is not possible to reduce the parasitic capacitances between the individual electrodes and so consequently there is also no demonstration of how to attend to combating the problem of the high resistances of the electrode connections.

Previously known structures are distinguished by the fact that they require a multiplicity of individual production steps, it not being possible for all the electrode connections and the electrical connections between the individual circuit elements to be produced simultaneously in a manner that saves time and reduces costs.

Widmann et al., "Technologie hochintegrierter Schaltungen" [Technology of large-scale integrated circuits], $2^{nd}$ edition, Springer Verlag, have previously disclosed a field-effect transistor wherein the customary technique of field oxide is still used for insulation purposes, wherein additional masks and method steps are necessary for producing the conductor and contact layers.

The use of a titanium nitride layer for local wiring is described by Alvares, "BiCMOS TECHNOLOGY AND APPLICATIONS", Kluwer Academic Publishers, ISBN 0-7923-9033-4. In that case, too, complicated photodevelopment and process steps are necessary for producing the local wiring, the relatively high-resistance layers of the titanium nitride layers (15 Ohm/Square) having a disadvantageous effect.

Consequently, limits are imposed on the usability of conventional semiconductor technology in the SHF range, in particular in the range of several gigahertz, on account of the fact that the conventional technology of producing electrode contacts and electrical connections within the integrated circuit is limited by the parasitic capacitances and by the technology-dependent resistances of the lines and contacts.

Consequently, the principle problem resides in producing transistor structures with a sufficiently low contact resistance at the source, drain and gate contacts and a correspondingly low parasitic capacitance between the connections and the substrate.

SUMMARY OF THE INVENTION

It is accordingly an object of the invention to provide an integrated semiconductor component and a method for producing the component, which overcomes the above-mentioned disadvantages of the heretofore-known devices and methods of this general type and which, while saving mask steps during the production process, in particular increases the yield during production and reduces the production costs as a result of this and as a result of the time saving. It is a further object of the invention to provide a method for producing electrical connections between individual circuit elements formed on or in a semiconductor substrate which reduces the requisite process steps to a minimum, the conductivity of the electrical connections being maximized.

With the foregoing and other objects in view there is provided, in accordance with the invention, a method of producing an integrated semiconductor component with a plurality of elevated electrode connections projecting relative to the main surface of the substrate, which comprises the following method steps:

providing a semiconductor substrate having a main surface;

forming an insulation layer on the main surface and at least partly covering the semiconductor substrate;

forming an insulation covering layer on the insulation layer;

partly removing the insulation layer and the insulation covering layer lying above the insulation layer;

applying an electrode connection layer on at least one of the main surface of the semiconductor substrate and the insulation covering layer; and simultaneously forming the elevated electrode connections projecting from the main surface by carrying out at least one of the following steps: removing the electrode connection layer in regions adjoining the electrode connections, and removing the insulation covering layer in regions adjoining an electrode connection to be produced.

In other words, the invention provides for an integrated component to be formed on a semiconductor substrate and having a plurality of electrode connections which are formed such that they project relative to the main surface of the substrate. The method includes the following method steps:

forming an insulation layer which at least partly covers the substrate on the main surface of the semiconductor substrate, forming an insulation covering layer on the insulation layer, partly removing the insulation layer with the insulation covering layer lying above it, applying an electrode connection layer on the main surface of the semiconductor substrate and/or on the insulation covering layer, and simultaneously forming the elevated electrode connections which project relative to the main surface by removing the electrode connection layer, in particular by means of an etching process, in regions adjoining the electrode connections to be fabricated, and/or by removing the insulation covering layer in regions adjoining the electrode connection to be fabricated.

The invention proposes producing all the electrode connections of the integrated semiconductor component simultaneously on the main surface of the substrate from an electrode connection layer. The advantage of this procedure is that the simultaneous production of the electrode connections opens up the so-called self-aligning ("self-aligned") technique, which is highly advantageous in particular in the case of structure dimensions near the resolution limit. The simultaneous production additionally saves mask and etching or patterning steps which are otherwise customary in the case of non-simultaneous production.

In an advantageous manner, interconnects which connect the semiconductor component to further integrated components formed on or in the semiconductor substrate are produced at the same time as the electrode connections. As a result of this, like the electrode connections, the interconnects and electrical connections are likewise produced using the self-aligning technique, or are not produced in steps that have to be carried out especially and require separate mask steps.

In accordance with a refinement of the invention, the interconnects are produced from the electrode connection layer, the electrode connection layer is removed, in particular by way of an etching process, in regions adjoining the interconnects to be fabricated.

Advantageously, a first and/or a third electrode connection are/is formed directly on the substrate and/or in part on the insulation covering layer.

A particularly advantageous and therefore preferred refinement of the invention provides for a second electrode connection to be formed completely on the insulation covering layer. This enables a gate contact which is electrically insulated from the substrate.

Advantageously, at least one doped region lying within the semiconductor substrate is formed after the production of the electrode connections on the semiconductor substrate and/or on the insulation covering layer. As a result of this, a field-effect zone is made possible, for example, which enables the construction of a diode or transistor. What is also equally made possible is production of a substrate connection with an improved junction contact.

In accordance with a preferred refinement of the invention, the doped region is produced by diffusion of a doping material through the insulation layer and/or from the latter into the semiconductor substrate. The doped region can be produced in a particularly simple and locally delimited manner as a result of this.

A further advantageous method step provides for at least a first and a second electrode connection to be produced at least partly on the insulation layer, the electrode connection layer and the insulation covering layer above the insulation layer being removed in an intermediate region between the two electrode connections.

The doped region is advantageously produced in the intermediate region under the insulation layer.

According to a further preferred method step, before the production of the doped region, lateral insulation layers are produced on the side areas of the at least one electrode connection, thereby avoiding indiffusion of the doping material into the at least one electrode connection.

Preferably, at least three electrode connections are produced, wherein case, between two of the three electrode connections, respectively, a respective doped region is produced under the insulation layer in the semiconductor substrate. This enables a structure for producing a field-effect transistor.

In accordance with a further advantageous variation, in the regions wherein the electrode connections are formed directly on the substrate, dopants are diffused, in particular by means of a heat-treatment process (i.e., annealing), from the electrode connections into indiffusion regions of the substrate in order to improve contact-making of the electrode connections with the substrate and/or of the doped region. This ensures better electrical contact between the electrode connections and the doped region and/or the substrate.

A preferred and advantageous refinement provides for the electrode connection layer and/or at least one of the electrode connections and/or at least one interconnect to be formed partly or entirely above at least one shallow-trench isolation formed in the semiconductor substrate. Parasitic capacitances can be further reduced as a result of this.

Advantageously, a field-effect transistor having at least a source connection, a gate connection and a drain connection and/or a substrate connection are/is produced by the method according to the invention.

A preferred refinement provides for a filling to be applied on the substrate and/or the insulation layer and between the electrode connections and/or the interconnects, in such a way that a planarized, level surface is produced which terminates with that side of the electrode connections and/or of the interconnects which is remote from the substrate.

Accordingly, oxide and/or borophosphorus silicate glass are/is advantageously used for the fillings.

In accordance with a particularly advantageous and therefore preferred method step, at least one of the electrode connections and/or of the interconnects are/is removed up to a predetermined level—in particular into the previously planarized surface.

The depression formed by the removal of the electrode connection/connections and/or of the interconnect(s) between the fillings formerly adjoining the latter is advantageously filled with a conductor layer made of a readily conductive material. Accordingly, according to a further advantageous refinement of the invention, titanium and/or tungsten and/or aluminium and/or tantalum and/or copper and/or gold and/or platinum and/or a combination thereof are/is used as the readily conductive material.

Preferably, after the depression has been filled with the readily conductive material, siliciding of the readily conductive material with the underlying electrode connection or the interconnect and/or the electrode connection layer is produced by means of a heat treatment ("annealing"). This further improves the contact made between the readily conductive material and the underlying electrode connection.

In order to improve the contact further, a further refinement of the method provides that before the process of filling with the readily conductive material, that side area of the electrode connection or of the interconnect which forms the depression and is remote from the main surface of the substrate and/or those side areas of the filling or of the side-area insulation layers which face the depression are covered with a contact layer.

A particularly preferred refinement provides for the filling with the readily conductive material to form a conductor layer ("local interconnect system") by which individual integrated components formed on or in the semiconductor substrate are connected to one another. As a result of this, in a mask/production step with the electrode connections, it is possible to produce the connection/interconnect layer for electrically connecting the individual electronic components of an integrated semiconductor circuit on a common substrate using the so-called "self-aligning" technique. Mask and patterning steps that are otherwise necessary for this purpose are obviated.

With the above and other objects in view there is also provided, in accordance with the invention, a method for producing electrical connections between individual circuit elements formed on or in a semiconductor substrate. The novel method includes the following steps:

producing the individual circuit elements to be connected, in or on the semiconductor substrate, planarizing the circuit elements on or in the semiconductor substrate by filling depressions and unevennesses with a filling material, making interconnect channels into the planarized area comprising circuit elements and filling material, and filling the interconnect channels with a readily conductive material.

According to a preferred method step, after the interconnect channels have been filled with the readily conductive material, the semiconductor material lying under the interconnect channels is silicided with the conductive material by means of a heat treatment (i.e., annealing). This enables improved contact-making.

A likewise preferred step of the method provides that, before the interconnect channels are filled with the readily conductive material, one or more layers is or are applied, in order to improve contact-making, on the semiconductor material lying under the interconnect channels and/or the side areas of the side-area insulation and/or the side areas.

A likewise advantageous aspect of the invention relates to a semiconductor component having a semiconductor substrate and a plurality of electrode connections which are formed such that they project relative to the main surface of the substrate, wherein case an insulation layer is formed on the main surface of the semiconductor substrate, the said insulation layer at least partly covering the said main surface, which insulation layer is at least partly covered with an insulation covering layer, and at least one of the electrode connections is formed completely on the insulation layer and/or the insulation covering layer and the further electrode connections are formed at least partly on the insulation layer and/or the insulation covering layer.

Advantageously, the electrode connections are formed from the same material and with the same vertical dimensions (height above the substrate). This gives a uniform surface and opens up the possibility of using so-called self-aligning patterning.

A preferred refinement of the invention provides for the electrode connections to be formed from one and the same electrode connection layer, in particular by means of an etching patterning step. This results in the electrode connections being identical in terms of the vertical dimensions and physical properties.

In accordance with an advantageous feature of the invention, a highly doped region is located in the substrate under at least one of the electrode connections. Such a highly doped region makes it possible to make contact with the substrate and/or a region thereof.

An advantageous refinement of the invention provides for a doped region to be located in the substrate under at least one region lying between the electrode connections. Accordingly, a further highly advantageous and therefore preferred refinement of the invention provides for the semiconductor component to be a field-effect transistor.

A readily conductive material is advantageously applied on a first and/or a second and/or a third electrode connection. Metallic contacts and interconnects can be realized as a result of this.

Therefore, an advantageous refinement of the invention provides for different semiconductor components formed on the same substrate to be electrically connected to one another by means of the readily conductive material.

In order to improve the contact, a preferred refinement of the invention provides for the readily conductive material to be connected to the underlying material of the electrode connections by siliciding.

Other features which are considered as characteristic for the invention are set forth in the appended claims.

Although the invention is illustrated and described herein as embodied in a semiconductor component, a method for producing the component, and a method for producing electrical connections between individual circuit elements, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

FIGS. 1 to 11 illustrate the method according to the invention for producing an integrated semiconductor component according to the invention and a substrate connection and an interconnect. In this case, the designations in FIGS. 1 to 11 apply analogously to identical or functionally equivalent parts.

Figure 1:
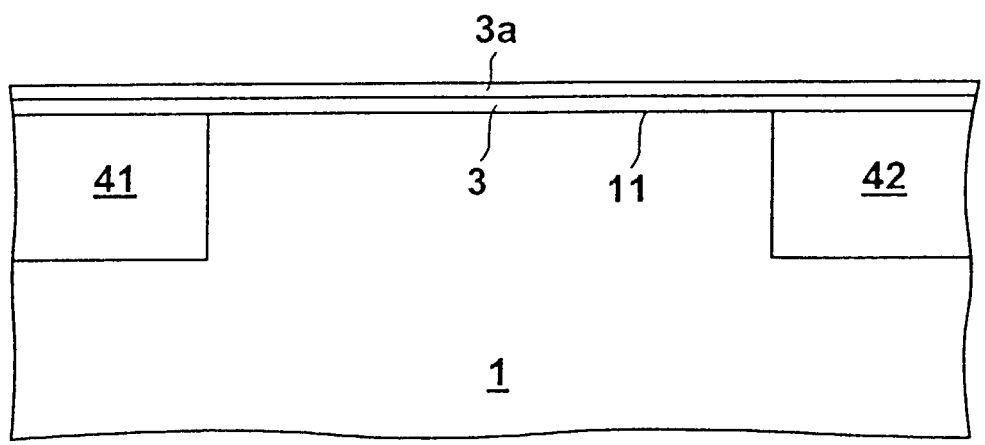
FIG. 1 is a schematic cross-sectional view through a substrate with shallow-trench isolations and layers applied thereon.

Referring now to the figures of the drawing in detail and first, particularly, to FIG. 1 thereof, there is shown a semiconductor substrate 1 with shallow-trench isolations 41 and 42 already produced therein and with an insulation layer 3 formed on the isolations and on the main surface 11 of the semiconductor substrate 1. An insulation covering layer 3a is formed on the insulation layer 3. The insulation layer 3 is thereby formed by a thin (gate) oxide layer and the insulation covering layer 3a is formed by a thin polysilicon layer. The shallow-trench isolations are not always necessary; they are used instead of the field oxide that is otherwise customary in this case.

Figure 2:
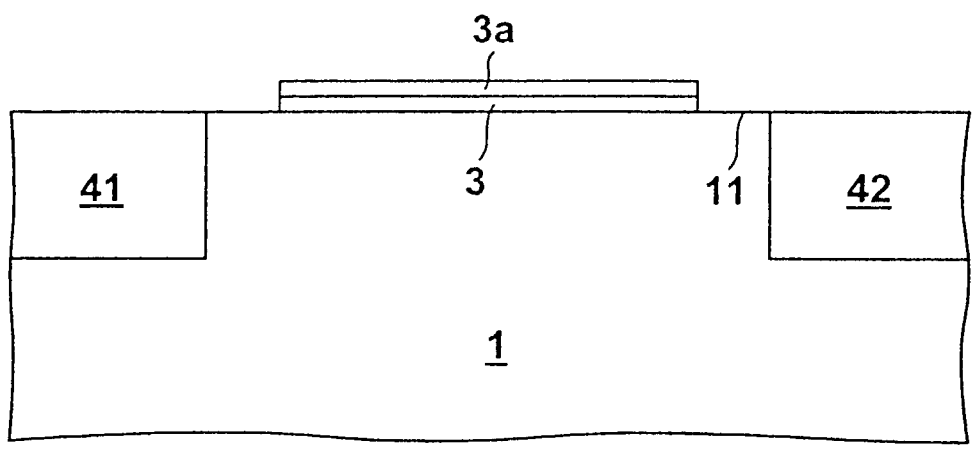
FIG. 2 is a schematic cross-sectional view through a substrate with layers applied thereon after a patterning step.

In FIG. 2, the insulation layer 3 and the insulation covering layer 3a have been patterned by way of a first lithography and etching step. As a result, the substrate 1 becomes accessible at the surface 11 in small regions.

Figure 3:
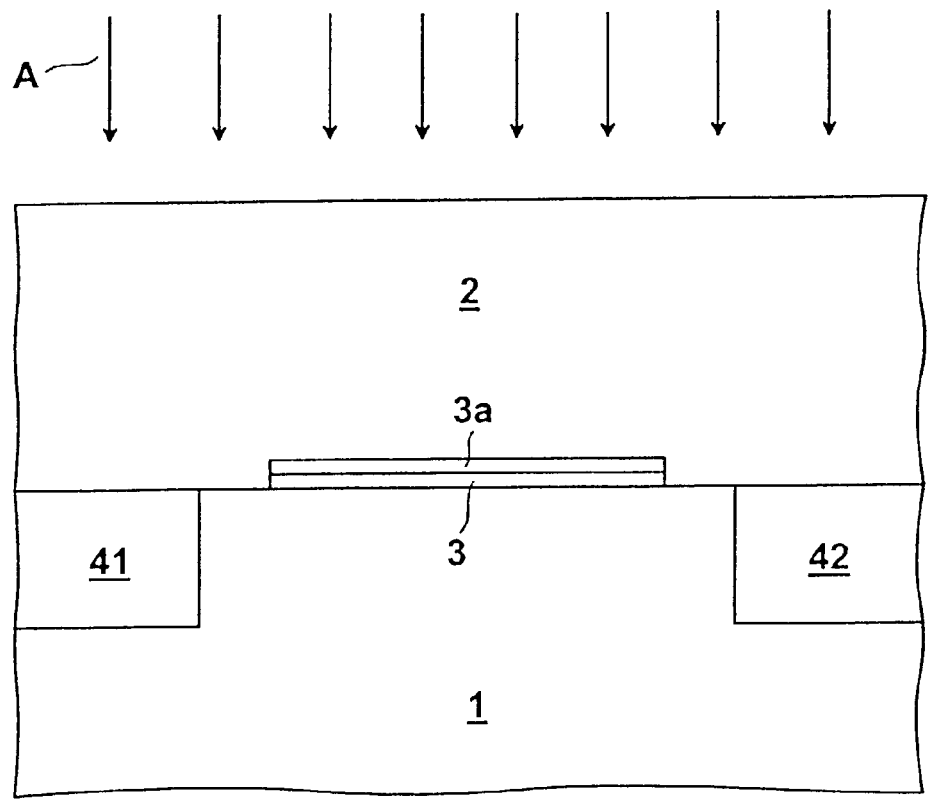
FIG. 3 is a schematic cross-sectional view through a substrate with layers applied thereon and an electrode connection layer.

Since the electrode connections are fabricated from the electrode connection layer 2 in the further process steps, the polysilicon layer forming the electrode connection layer 2 must already be highly doped in-situ or be doped after it has been applied in a further step, as illustrated in FIG. 3, by means of diffusion A of suitable doping material. In this case, the electrode connection layer 2 is grown or deposited on the surface of the trench isolations 41 and 42 of the substrate 1 and of the insulation covering layer 3a.

Figure 4:
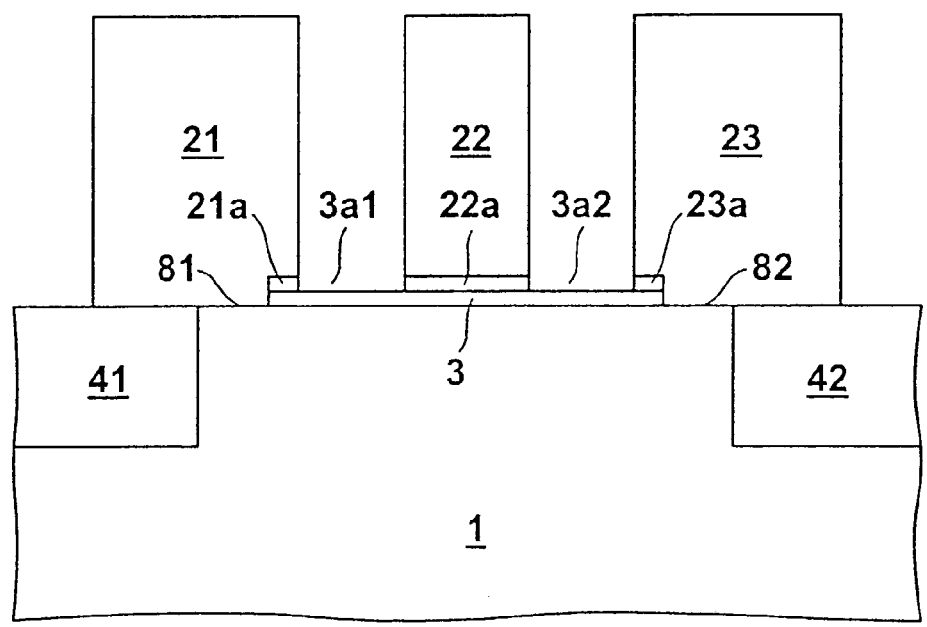
FIG. 4 is a schematic cross-sectional view through a substrate with electrode connections applied thereon which have been fabricated from the layers by means of a patterning step.

After this, as illustrated in FIG. 4, the electrode connection layer 2 and the insulation covering layer 3a are patterned, thereby producing the electrode connections 21, 22 and 23. The first (source) electrode connection 21 is formed for the most part on the first shallow-trench isolation 41 and to a lesser part on the accessible contact are a 81 of the substrate 1 and on the insulation covering layer 21a. The second (gate) electrode connection 22 is electrically insulated from the substrate since it is formed completely on the insulation layer 3 or the insulation covering layer 22a. The third (drain) electrode connection 23 is again formed for the most part on a shallow-trench isolation 42 and partly on a contact area 82, which exposes the substrate 1, and the insulation covering layer 23a. The source and drain electrode connections 21 and 23 are thus only partly in electrical contact with the substrate on the partial areas 81 and 82. The fact that the dimensions of the electrode connections are larger than the contact points 81 and 82 with the substrate means that the contact resistances are lower.

Figure 5:
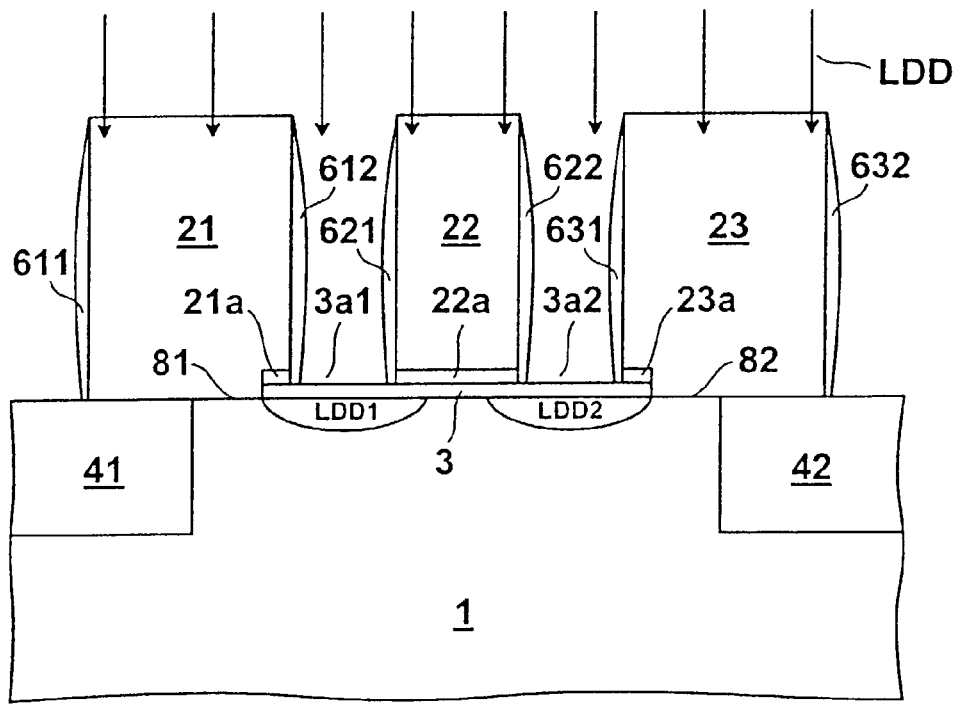
FIG. 5 is a schematic cross-sectional view through a substrate with electrode connections applied thereon and having lateral insulation layers.

FIG. 5 illustrates the next process steps. Firstly, lateral insulation layers 611 to 632 are produced by means of reoxidation on the side areas of the electrode connections 21, 22 and 23. This protects the electrode connections against the next process steps and, in particular, prevents undesired doping. The production of the doped regions LDD1 and LDD2 which are necessary for a field-effect transistor in the semiconductor substrate 1 is effected by means of suitable dopants LDD through implantation and through a suitable heat-treatment process ("annealing"). The dopants LDD are diffused into the semiconductor substrate 1 (through the insulation layer 3), as a result of which the doped regions LDD1 and LDD2 illustrated are produced directly under the uncovered regions 3a1 and 3a2 of the insulation layer 3.

Figure 6:
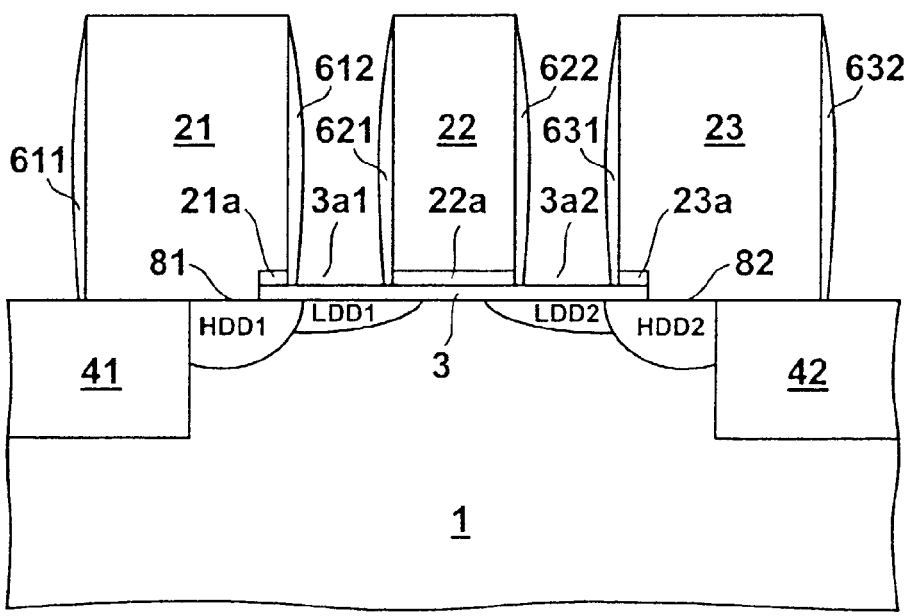
FIG. 6 is a schematic cross-sectional view through a substrate with electrode connections applied thereon and highly doped regions underneath the electrode connections.

In FIG. 6, the diffusion of highly doped dopants that has already taken place from the electrode connections 21 and 23 into the substrate has been performed, thereby producing the highly doped (contact) regions HDD1 and HDD2 illustrated in the substrate 1. In this case the highly doped (contact) regions HDD1 and HDD2 serve for achieving an improved electrical junction or contact-making of the doped regions LDD1 and LDD2.

Figure 7:
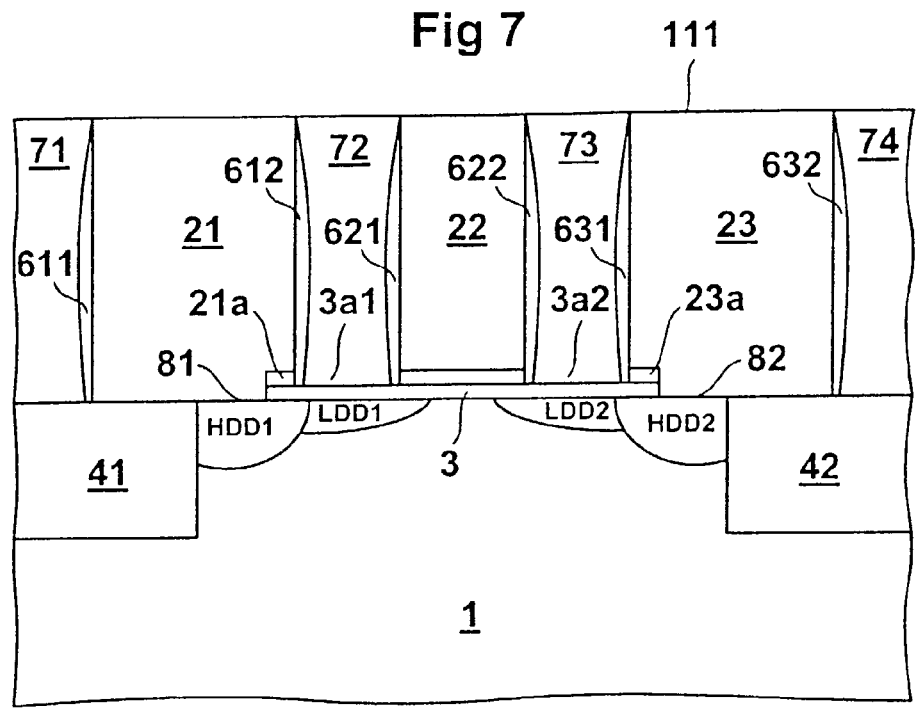
FIG. 7 is a schematic cross-sectional view through a substrate with planarized electrode connections applied thereon and fillings between the electrode connections.

In order to planarize the surface 111, the remaining unevennesses and depressions between the electrode connections are filled with fillings 41 to 74 (FIG. 7). Borophosphorus silicate glass, for example, can be used for this purpose. In this case, the surface can be additionally smoothed by means of a chemical mechanical polishing process. Since the structure applied on and in the semiconductor substrate 1 is fully planarized at this stage, a standard silicidation process can readily be carried out for producing the contacts and/or the interconnects. The metal required for this purpose could simply be deposited and, in a suitable heat-treatment process ("annealing"), bring about the silicidation on the electrode connections 21, 22 and 23. The residual metal that has not reacted with the semiconductor material could easily be removed afterwards in a suitable etching process.

Figure 8:
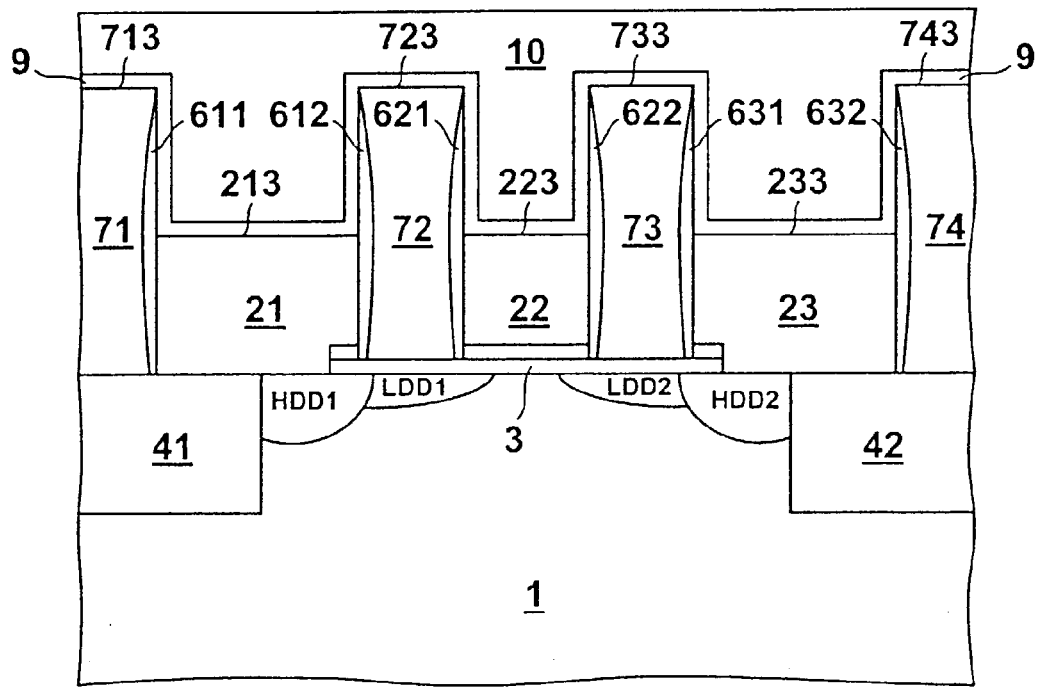
FIG. 8 is a schematic cross-sectional view through a substrate with electrode connections applied thereon and depressions filled with a conductor layer.

A further approach to producing the contacts and/or the interconnects is illustrated in FIG. 8. In this case, by means of a suitable etching process, for example a reactive ion etching process, the electrode connections 21 to 23 composed of polysilicon have initially already been removed up to a predetermined level. A bromine-based etching gas mixture can be used here for the reactive ion etching process, since this results in good selectivity of the etching process with regard to the electrode connections.

After the surfaces have been suitably cleaned, for example using a hydrogen-fluorine compound, a thin contact layer 9, for example made of a titanium nitride layer, is deposited and—as illustrated in FIG. 8—covered with a conductor layer 10, which fills the depressions in the surface again. In this case, the conductor layer 10 may suitably be composed of tungsten and fills the depressions and interconnect channels resulting from the removal of the electrode connections 21 to 23. Also conceivable here are tungsten nitride compounds or layers of titanium, titanium nitride and tungsten or, instead of tungsten, aluminium or copper in conjunction with tantalum instead of titanium.

Figure 9:
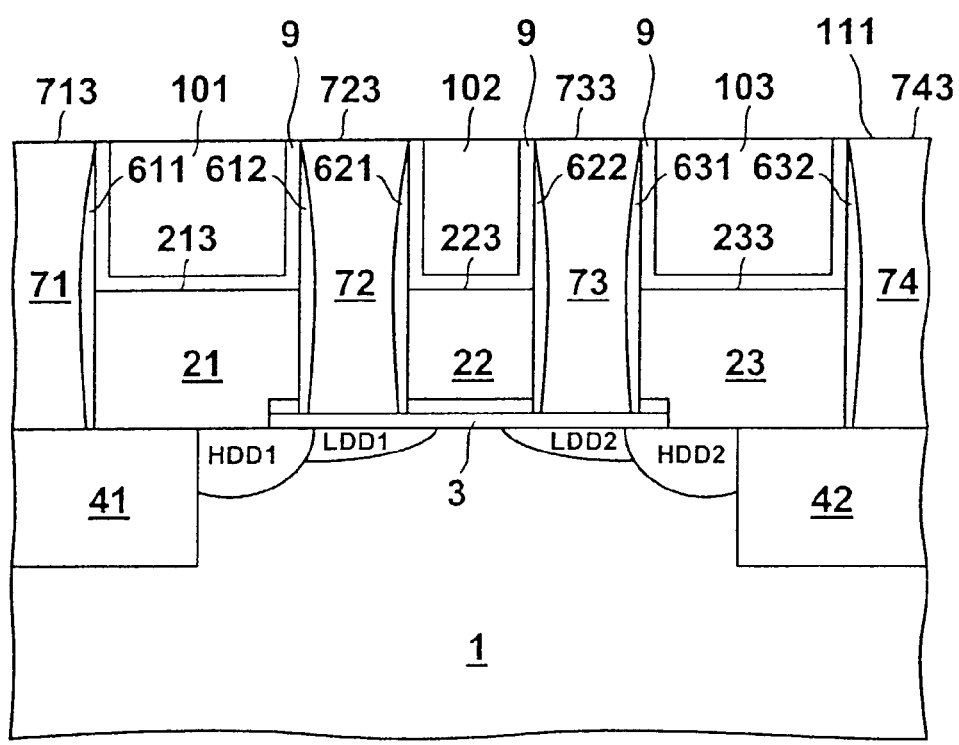
FIG. 9 is a schematic cross-sectional view through a substrate with planarized electrode connections applied thereon and having a conductor layer.
Figure 10:
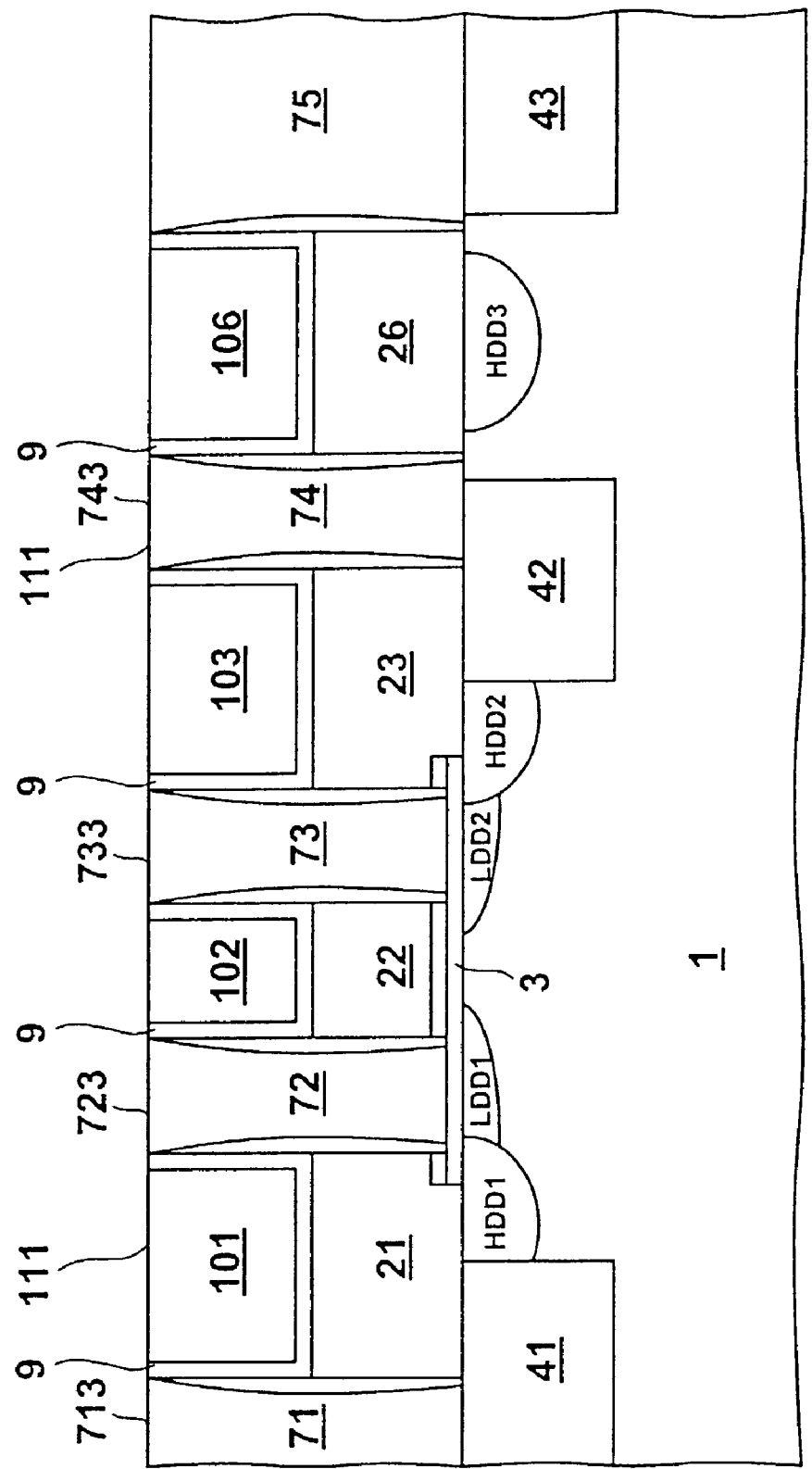
FIG. 10 is a schematic cross-sectional view through a substrate with planarized electrode connections applied thereon and having a conductor layer and a substrate connection.

FIG. 9 shows the result of a further planarization process, preferably once again a chemical mechanical polishing process, as a result of which the surface 111 of the structure is smoothed. The applied metal layer (10, 101 to 103) is removed for this purpose down to the level of those surfaces 713 to 743 of the fillings 71 to 74 which are remote from the substrate. This produces a highly conductive interconnect layer made of metal in the structure, the surface 111 being uniform and level.

A hydrogen peroxide solution is preferably used for the chemical mechanical polishing process, since this solution advantageously contains no undesirable impurities (elements), which occur for example in the known iron nitrate solutions that are otherwise used as standard. Iron constituents in the latter solutions diffuse undesirably in the form of iron ions into the crystalline silicon (substrate, connections), where they act as disturbing recombination centres. After the polishing process, the structure is ready for the performance of further processes on the contacts, which can be carried out by means of high-resolution lithography since there are no unevennesses to impede focusing.

The fully planarized surface of the structure that is finally obtained by the method of the invention can in turn easily be used to form further layers. In contrast to conventional practice multilayer structures can thus be produced, or are possible for the first time, in a simple manner.

FIG. 10 once again shows a cross section through a structure applied and introduced on a semiconductor substrate 1, a substrate connection additionally being shown, which is produced simultaneously with the electrode connections 21, 22 and 23 and, in order to improve the substrate contact-making, has a highly doped region HDD3 under its electrode connection 26 and conductor layer 106 situated thereon. The highly doped region HDD3 is once again produced by diffusion of doping material from the electrode 26.

Figure 11:
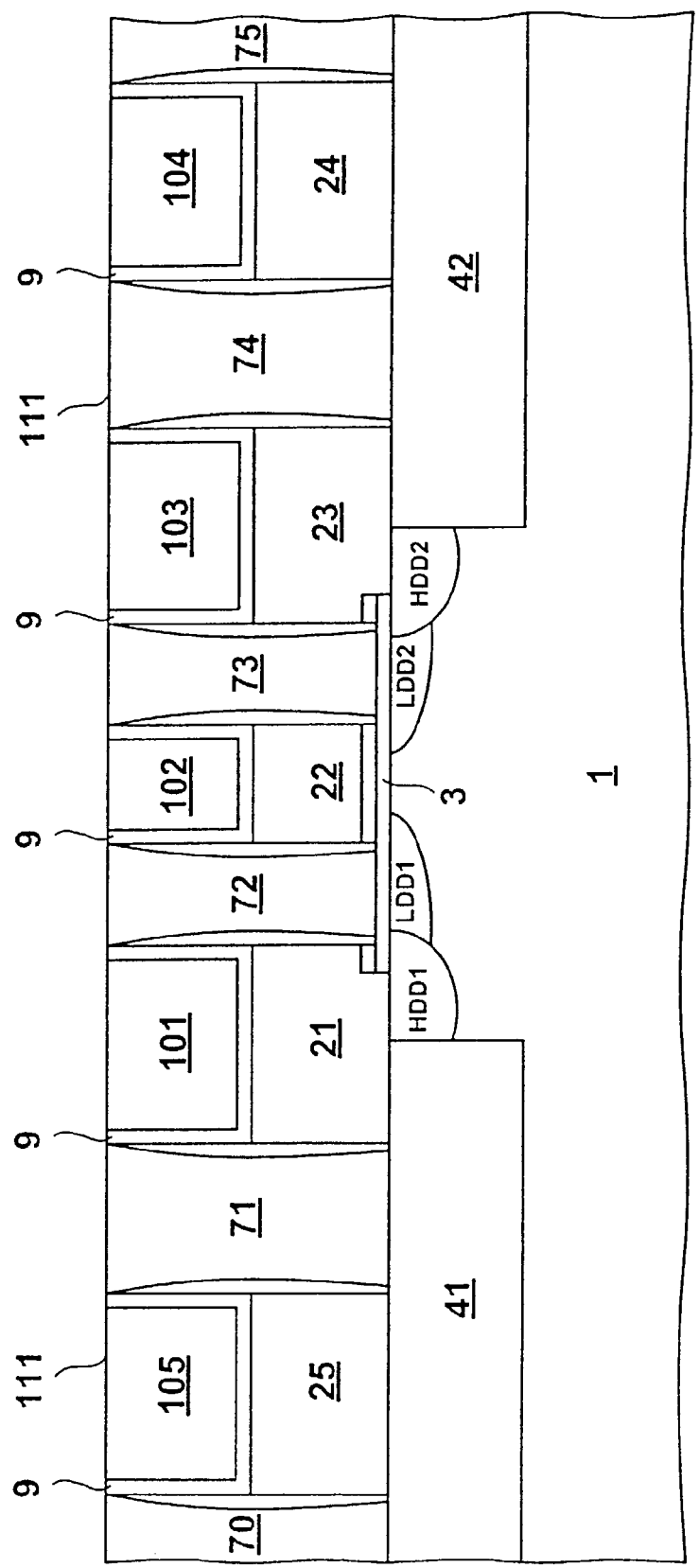
FIG. 11 is a schematic cross-sectional view through a substrate with planarized electrode connections applied thereon and having a conductor layer and an interconnect.

Finally, FIG. 11 shows a cross section that is likewise chosen by way of example, through a structure produced by the method according to the invention. Interconnects 104 and 105, and 24 and 25, which connect individual components and are likewise formed on shallow-trench isolations 41 and 42 are illustrated.

We claim:

1. A semiconductor component, comprising:
a semiconductor substrate having a main surface;
an insulation layer formed on and at least partly covering said main surface of said semiconductor substrate, said insulation layer having a first lateral edge portion and a second lateral edge portion; and
a plurality of electrode connections projecting above said main surface of said semiconductor substrate, said plurality of electrode connections including at least a gate electrode connection formed completely on of said insulation layer, a source electrode connection formed at least partly on said first lateral edge portion of said insulation layer and partly on said semiconductor substrate, and a drain electrode connection formed at least partly on said second lateral edge portion of said insulation layer and partly on said semiconductor substrate.

2. The semiconductor component according to claim 1, wherein said electrode connections are all formed from the same material and with substantially identical vertical dimensions above said substrate.

3. The semiconductor component according to claim 1, wherein said electrode connections are structures formed from one electrode connection layer.

4. The semiconductor component according to claim 1, wherein said electrode connections are etched and patterned structures.

5. The semiconductor component according to claim 1, which further comprises a highly doped region formed in said substrate under at least one of said electrode connections.

6. The semiconductor component according to claim 1, which further comprises a doped region formed in said substrate under at least one region between said electrode connections.

7. The semiconductor component according to claim 1, wherein said semiconductor component is a field-effect transistor.

8. The semiconductor component according to claim 1, which further comprises a readily conductive material applied on at least one of said plurality of electrode connections.

9. The semiconductor component according to claim 8, which comprises different semiconductor components formed on said substrate and electrically connected to one another by way of said readily conductive material.

10. The semiconductor component according to claim 8, wherein said readily conductive material at least partly comprises a material selected from the group consisting of titanium, tungsten, aluminium, tantalum, copper, platinum, and gold.

11. The semiconductor component according to claim 10, wherein said readily conductive material is connected to an underlying material of said at least one electrode connection by a silicided connection.

* * * * *